United States Patent [19]

Shimozato et al.

[11] Patent Number: 4,612,206

[45] Date of Patent: Sep. 16, 1986

[54] METHOD OF CONTROLLING DEPOSITION AMOUNT DISTRIBUTION IN A VACUUM DEPOSITION PLATING

[75] Inventors: Yoshio Shimozato; Tetsuyoshi Wada; Kenichi Yanagi; Mitsuo Kato; Heizaburo Furukawa; Kanji Wake, all of Hiroshima; Arihiko Morita, Sakai; Norio Tsukiji, Sakai; Takuya Aiko, Sakai; Toshiharu Kittaka, Sakai; Yasuji Nakanishi, Sakai, all of Japan

[73] Assignees: Nisshin Steel Company, Ltd.; Mitsubishi Jukogyo Kabushiki Kaisha, both of Tokyo, Japan

[21] Appl. No.: 740,553

[22] Filed: Jun. 3, 1985

[30] Foreign Application Priority Data

Jun. 4, 1984 [JP] Japan .................. 59-113195

[51] Int. Cl.[4] .............. C23C 16/00; C23C 16/06
[52] U.S. Cl. ........................ 427/9; 118/692; 118/718; 118/726; 427/250; 427/255.5
[58] Field of Search ............ 427/9, 250, 255.5; 118/692, 718, 726

[56] References Cited

U.S. PATENT DOCUMENTS

| 3,040,702 | 6/1962 | Eng et al. | 118/718 |
| 3,854,442 | 12/1974 | Adam et al. | 118/718 |
| 4,051,270 | 9/1977 | Butler | 427/9 |
| 4,526,802 | 7/1985 | Sato | 118/692 |

FOREIGN PATENT DOCUMENTS

| 2747061 | 4/1979 | Fed. Rep. of Germany | 118/718 |
| 54-28781 | 3/1979 | Japan | 118/718 |

Primary Examiner—Sadie L. Childs
Attorney, Agent, or Firm—Webb, Burden, Robinson & Webb

[57] ABSTRACT

In a continuous vacuum deposition plating of a metal strip, thinner coating at the edges can be prevented by maintaining the pressure of the deposition chamber in which an evaporation chamber is housed at a properly higher level than the pressure of the evaporation chamber.

5 Claims, 9 Drawing Figures

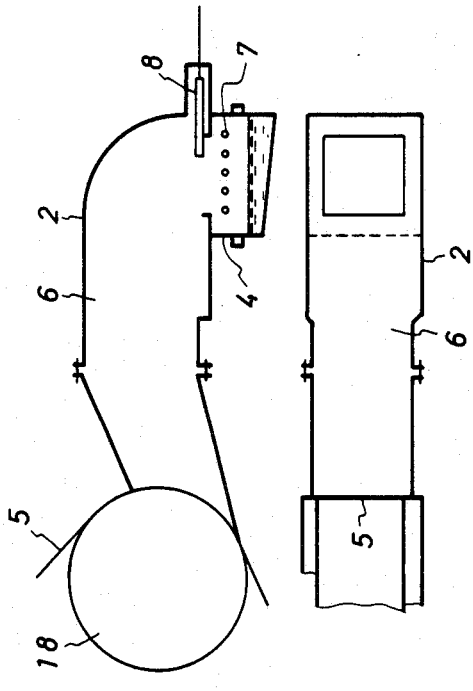
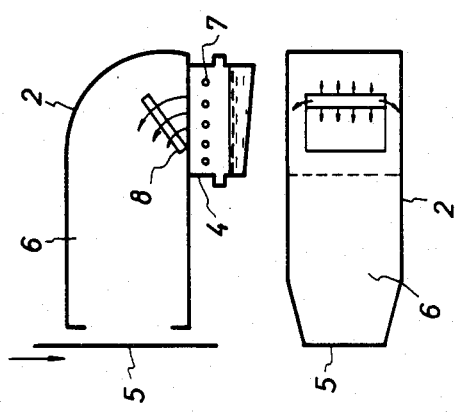
FIG. 2(a)
FIG 2(b)

FIG. 3(a)
FIG. 3(b)
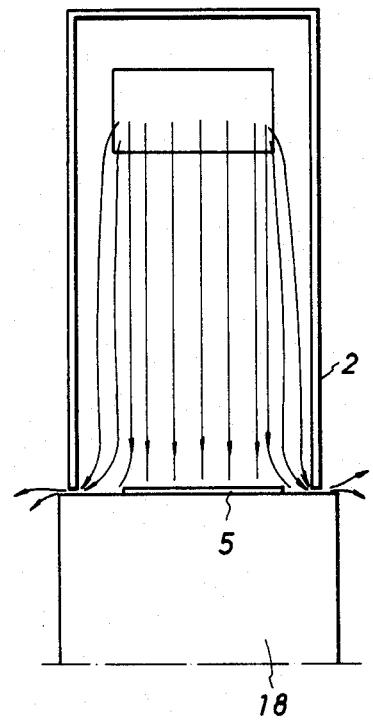
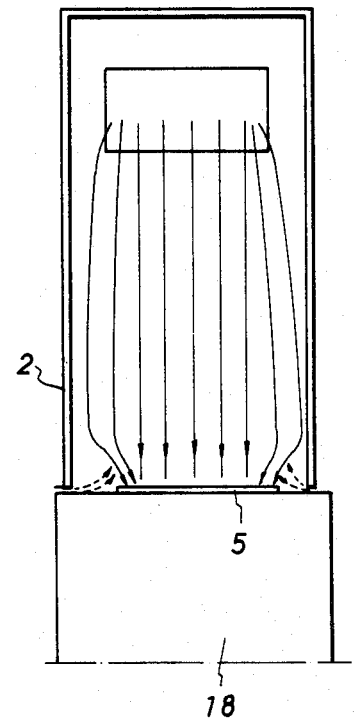

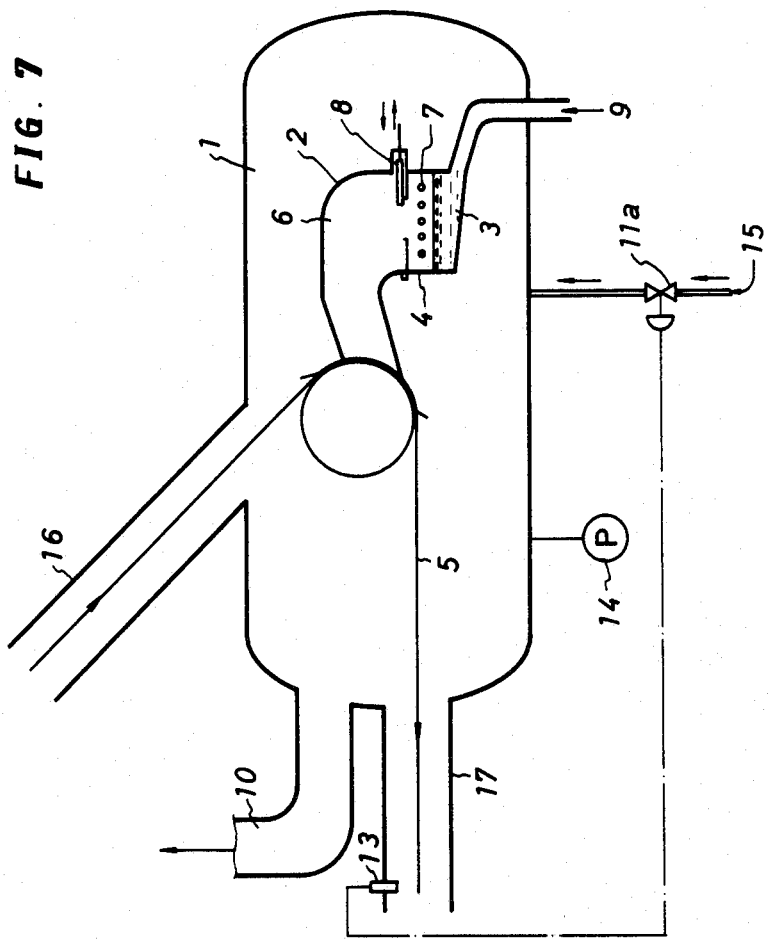

METHOD OF CONTROLLING DEPOSITION AMOUNT DISTRIBUTION IN A VACUUM DEPOSITION PLATING

FIELD OF THE INVENTION

This invention relates to a continuous vacuum deposition plating process. More particularly, this invention relates to a method of controlling deposition amount distribution or deposition thickness distribution in a continuous vacuum deposition process.

BACKGROUND OF THE INVENTION

A continuous vacuum deposition apparatus comprises a vacuum deposition chamber which is provided with seal roll means through which a metal strip to be plated can be hermetically introduced and let out and contains a metal evaporation apparatus and a guide roll or rolls for the metal strip. A typical such apparatus is disclosed in Japanese Laid-Open Patent Publication No. 18646/72.

The evaporation apparatus comprises an evaporation bath and a vapor channel, the opening of which is placed close to the surface of the metal strip to be plated.

A problem when a metal strip is plated by the continuous vacuum deposition process using such an apparatus is that the surface of the strip is not uniformly plated but usually both edge portions are thinly coated because the inside pressure of the vacuum deposition chamber is lower than the vapor pressure in the evaporation chamber and therefore there is a leak of metal vapor at the periphery of the opening of the vapor channel, which causes a non-uniform thickness distribution.

The object of the present invention is to provide a method which enables a deposited film to be formed as uniformly as possible, overcoming the defect of the prior art that the deposited film is thinner at both edges of the substrate strip.

SUMMARY OF THE INVENTION

This invention provides a method of controlling the transverse thickness distribution of deposited metal film in a continuous vacuum deposition plating process using an apparatus comprising an evacuable deposition chamber in which an evaporation chamber for evaporating a metal to be deposited is contained and in which a substrate sheet strip is hermetically introduced and let out so that the metal vapor is deposited on the surface of the strip at the outlet of the evaporation chamber, said method comprising preliminarily determining the pressure difference between the evacuable deposition chamber and the evaporation chamber which will provide transversely uniform thickness of deposition, determining the vapor pressure in the evaporation chamber, which brings about a coating of a desired thickness, regulating the pressure of the deposition chamber so as to maintain said preliminarily determined pressure difference.

Although this method is applicable to te vacuum deposition plating of any substrate metal sheet with any deposition metal, in practice it is most conveniently applied to the plating of steel sheets with zinc.

BRIEF DESCRIPTION OF THE DRAWINGS

The invention will now be described in detail with reference to the attached drawings, of which:

FIGS. 2(a) and 2(b) illustrate two kinds of evaporation chamber of the conventional continuous vaccum deposition apparatus;

FIGS. 3(a) and 3(b) illustate vapor flows in the vapor channel;

FIG. 7 is a schematic view of another embodiment of a continuous vacuum deposition plating apparatus to which the present invention is applicable.

DETAILED DESCRIPTION OF THE INVENTION

Figure 1:
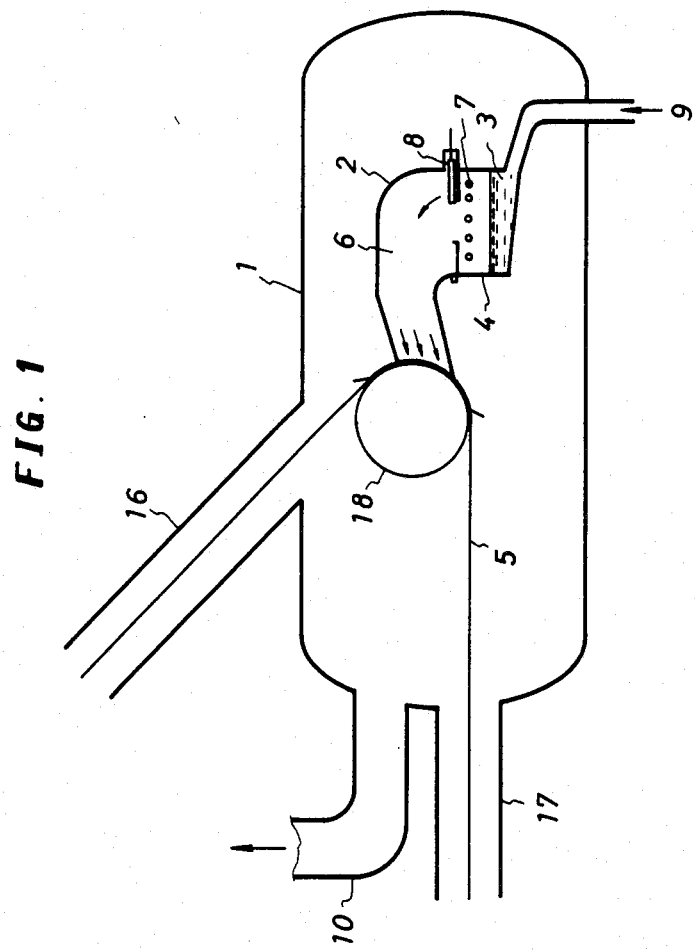
FIG. 1 is a schematic view of a conventional continuous vacuum deposition plating apparatus.

FIG. 1 is a schematic representation of a conventional continuous vacuum deposition plating apparatus. The apparatus comprises a vacuum deposition chamber 1 and an evaporation chamber 2. The vacuum deposition chamber 1 is provided with an inlet channel 16, an outlet channel 17, an exhaust duct 10 and a guide roll 18 for a substrate metal strip 5, etc., and can be evacuated by vacuum pump means (not shown) through the exhaust duct 10. The openings of the inlet channel 16 and the outlet channel 17 are respectively provided with a seal roll system (not shown) which allows, respectively, introduction of a metal strip to and egress from the vacuum deposition chamber 1 while maintaining the vacuum of the chamber. The seal roll system is known per se and disclosed in Japanese Patent Publication No. 18646/72, 20950/78, etc. for instance.

The evaporation chamber 2 comprises a melt bath 4, and a vapor channel 6 and is provided with a heater 7 and a shutter 8, etc. A metal 3 to be deposited is melted and evaporated in the bath 4 and is supplied from outside through a supply inlet 9 of the vacuum deposition chamber. The vapor passes through the vapor channel to an opening, where it is deposited onto the surface of the substrate strip which moves past the opening of the channel. The flow rate of the metal vapor to be deposited is controlled by regulating the electric power supplied to the electric heater 7 in the bath 4 and the aperture of a shutter 8.

The deposition chamber 1 is usually maintained at a pressure lower than the pressure in the evaporation chamber (vapor pressure of the metal). The surface of the substrate 5 is pre-cleaned.

In conventional processes, the pressure in the deposition channel 1 is kept constant by evacuation through the exhaust duct 10 by means of a vacuum pump (not shown).

Practical aspects of the conventional vacuum deposition procedure are shown in FIGS. 2(a) and 2(b), which are schematic representation of the evaporation chamber (in each figure the upper part is a side view and the lower part is a plan view). In the embodiment of FIG. 2(a), the substrate strip moves vertically and a butterfly valve 8 is provided, while in the embodiment of FIG. 2(b) the substrate strip moves around a guide roll 18 and a slide shutter 8 is provided. The other reference numbers represent the same parts as described above. In both embodiments, the vapor flow rate, that is, the deposition rate is controlled by the aperture of the shutter and the electric power supply to the heater 7 of the bath 4. Usually shutters are provided with an electric heater to prevent undesired deposition of metal thereon. The deposition position, that is, the guide roller for instance, may be provided with a heater to control deposition conditions.

Figure 4:
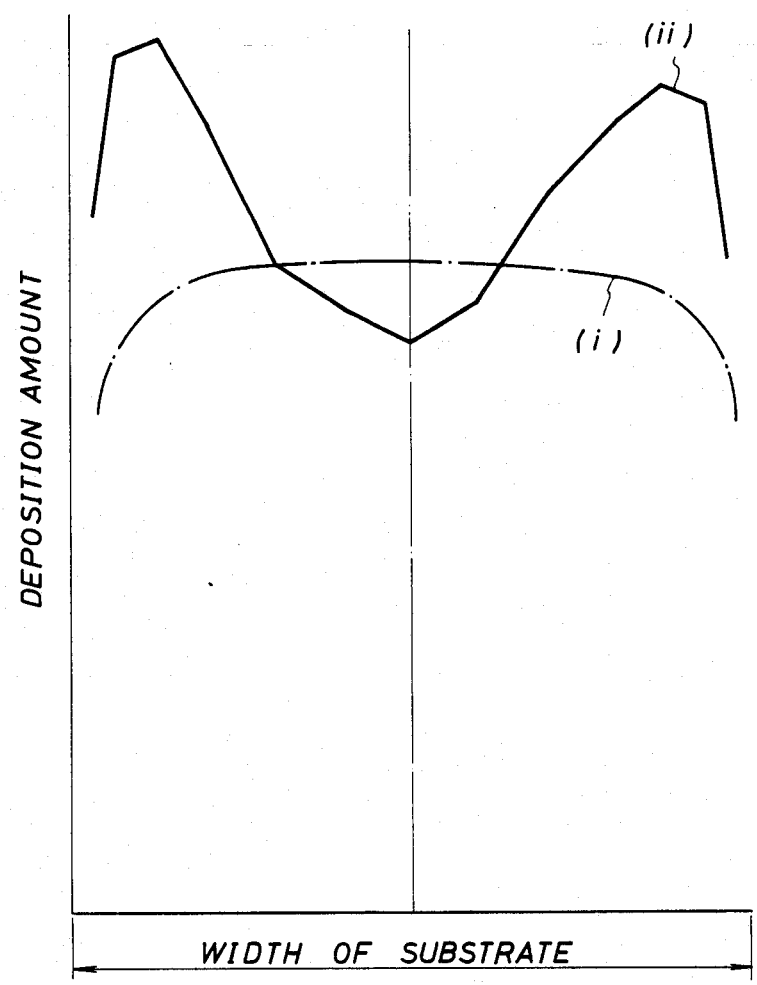
FIG. 4 graphically illustrates transverse thickness distributions of the deposited metal film plotted against the pressure variation in the deposition chamber.

In the above-described conventional deposition method, however, it has been a problem that the thickness (deposition amount) distribution in the deposited film is not uniform. In these apparatuses, when the pressure $P_{ch}$ in the evaporation chamber 2 is higher than the pressure $P_{atm}$ in the deposition chamber, that is, when $P_{ch} > P_{atm}$, as it usually is, the vapor flow in the channel 6 deviates outward at the peripheral portions at the channel opening, as shown in FIG. 3(a). Thus the obtained deposited metal film typically exhibits a thickness distribution as shown by Curve (i) in FIG. 4. On the contrary, should the pressure $P_{atm}$ in the deposition chamber 1 be indiscreetly raised higher than the pressure $P_{ch}$ in the evaporation chamber 2, that is, if $P_{ch} < P_{atm}$, the vapor flow in the channel 6 will tend to concentrate in the peripheral portions at the channel opening, as shown in FIG. 3(b). Thus the obtained deposited metal film typically exhibits a thickness distribution as shown by Curve (ii) in FIG. 4.

We have found that there is a correlation between the deposition chamber pressure and the evaporation chamber pressure which can produce a uniformly thick deposited film.

Figure 5:
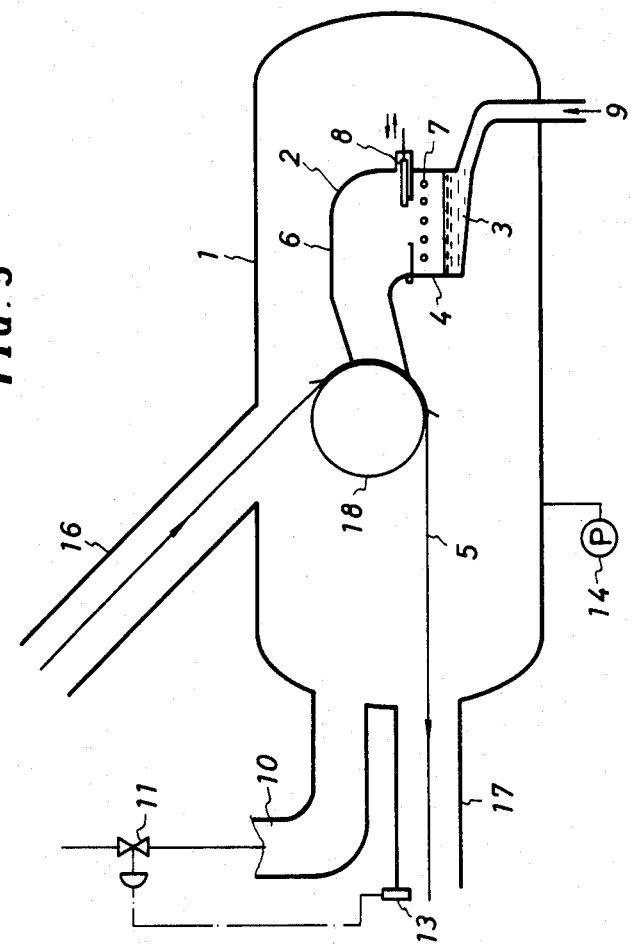
FIG. 5 is a schematic view of a continuous vacuum deposition plating apparatus with which the present invention is carried out.

The method of this invention can be carried out using an apparatus such as illustrated in FIG. 5. The fundamental parts of the apparatus are the same as those illustrated in FIG. 1. Reference numbers 1, 2, 3, 4, 5, 6, 7, 8, 9, 10, 16, 17 and 18 represent the same members as in FIG. 1. The apparatus of FIG. 5 is, however, provided with a thickness detector 13, a control valve 11 operated in accordance with fed-back information from the detector 13, and a manometer 14.

The above-described deposition apparatus works as follows. The pressure in the deposition chamber is variable, and therefore it is possible to vary the vapor flow in the evaporation chamber by controlling the pressure in the deposition chamber, and thus to make the thickness distribution of the deposited film uniform.

Figure 6:
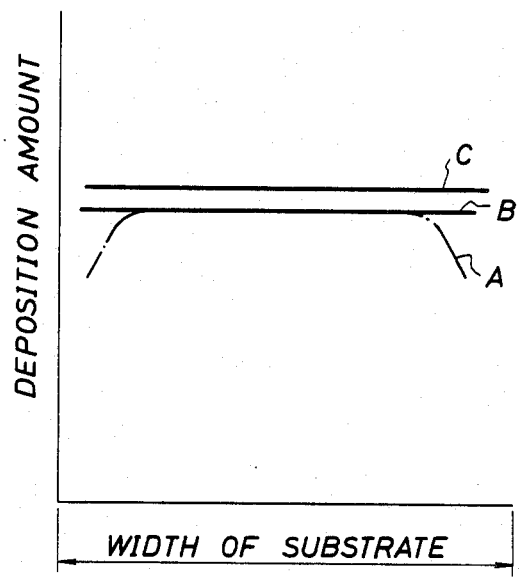
FIG. 6 is a graph showing the transverse thickness distributions of deposited metal films plotted against the inside pressures of the deposition chamber in the method of this invention.

That is, if the pressure in the deposition chamber (detectable by the manometer 14) is set lower in comparison with the pressure in the evaporation chamber 2 as in the conventional process, both edges of the substrate strip are plated thinner as shown in FIG. 6 by Curve A. In contrast, if the pressure in the deposition chamber 1 is carefully raised higher than the pressure in the evaporation chamber 2, there is a pressure difference which brings about a uniform thickness distribution as shown by Curve B. By establishing this pressure difference, thinner coating at the peripheries can be compensated for without changing the thickness of the central portion. If a thicker uniform deposited film such as represented by Curve C is desired, it is achieved by raising the vapor supply by regulation of the shutter aperture and/or power supply to the bath heater, maintaining said pressure difference. This pressure difference varies in accordance with the evaporation chamber pressure and the structure of apparatus. The regulated pressure of the deposition chamber may be higher or lower than that of the evaporation chamber.

This pressure difference is specific to the width of the strip and the construction of each apparatus. Therefore, we can learn this pressure difference by preliminary experiments with each apparatus. Thus it is possible to form a deposited film with a uniform thickness by regulating the difference of pressures in the deposition chamber 1 and the evaporation chamber 2. The thickness distribution of the deposited film is detected by the detector 13 and the information is fed back to a control means of a valve 11.

The detector may be a radiation thermometer. The temperature of the deposited film is proportional to the thickness, therefore, the thickness can be determined by measuring the temperature. In order to detect the thickness distribution, several thermometers are arranged transversely. Also the thickness can be measured by an X-ray fluorescent analyzer. This can be provided outside of the deposition chamber in such a way that it can scan the deposited film transversely.

The regulation of the pressure in the deposition chamber 1 can be effected by an apparatus as shown in FIG. 7. The apparatus of FIG. 7 is substantially the same as that of FIG. 5 except that it is provided with a leak-in valve 11a which is operated in accordance with the information fed back from the thickness detector 13. The pressure in the deposition chamber is regulated so as to maintain the predetermined pressure difference for an evaporation chamber pressure. Such a feedback control system is today commercially available or easily constructed by one having general knowledge of microcomputer techniques.

WORKING EXAMPLE

A mild steel strip 0.6 mm in thickness and 300 mm in width was plated with zinc in accordance with the method of this invention, using an apparatus substantially as illustrated in FIG. 5. The pressure in the evaporation chamber was 0.15 Torr. and temperature was 520° C. The pressure in the evaporation chamber cannot directly be measured. This was calculated from the temperature of zinc vapor, molecular weight of zinc, cross-sectional area of the vapor channel and evaporation rate (, which is calculated from deposition amount and line speed). (O. Knacke and I. N. Stranski, Progress in Metal Physics 6, 181 (1956)). The pressure in the deposition chamber was controlled to be maintained at 0.01 Torr. A zinc deposition film 6.5μ in thickness but thinner at both edges was deposited. The deposition chamber pressure was raised to 0.12 Torr. while the evaporation chamber pressure was maintained at 0.15 Torr. Thus a 6.5μ uniformly thick deposited film of a uniform 6.5 μm thickness was formed. This pressure difference of 0.03 Torr. had been determined from preliminary experiment. Finally the evaporation chamber pressure was raised to 0.23 Torr. and the deposition chamber was raised to 0.20 Torr. The temperature of the vapor in the evaporation chamber was 535° C. Then a uniformly 10μ thick deposition film was formed.

We claim:

1. A method of controlling the transverse thickness distribution of deposited metal film in a continuous vacuum deposition plating process using an apparatus comprising an evacuable deposition chamber in which an evaporation chamber for evaporating a metal to be deposited is contained and in which a substrate sheet strip is hermetically introduced and let out so that the metal vapor is deposited on the surface of the strip at the outlet of the evaporation chamber, said method comprising preliminarily determining the pressure difference between the evacuable deposition chamber and the evaporation chamber which will provide transversely uniform thickness of deposition, determining the vapor pressure in the evaporation chamber which brings about a coating of a desired thickness, and regulating the pressure deposition chamber so as to maintain preliminarily determined pressure difference.

2. The method as described in claim 1, wherein the substrate metal is steel strip and the metal to be deposited is zinc.

3. The method as described in claim 1, wherein the transverse thickness distribution of deposited metal film is detected and the detected information is fed back to a means which controls the pressure of the deposition chamber so that the determined pressure difference is maintained.

4. The method as described in claim 3, wherein the pressure control means is a valve to an evacuation means.

5. The method as described in claim 3, wherein the pressure control means is a leak-in valve.

* * * * *